United States Patent
Swale

(10) Patent No.: US 6,456,088 B1
(45) Date of Patent: Sep. 24, 2002

(54) 1ST LEVEL POWER FAULT TESTING APPARATUS FOR TESTING TELECOMMUNICATIONS EQUIPMENT

(75) Inventor: Gary L. Swale, Penngrove, CA (US)

(73) Assignee: Alcatel USA Sourcing, L.P., Plano, TX (US)

( * ) Notice: Subject to any disclaimer, the term of this patent is extended or adjusted under 35 U.S.C. 154(b) by 0 days.

(21) Appl. No.: 09/753,800

(22) Filed: Jan. 3, 2001

(51) Int. Cl.[7] ............................................. G01R 31/08
(52) U.S. Cl. ...................................... 324/525; 324/511
(58) Field of Search ...................... 329/26.01; 324/508, 324/511, 525, 537, 555, 520, 522

(56) References Cited

U.S. PATENT DOCUMENTS 4,370,609 A * 1/1983 Wilson ........................ 324/522
5,450,328 A * 9/1995 Janke .......................... 324/520

OTHER PUBLICATIONS

"Electromagnetic Compatibility and Electrical Safety Lightning and AC Power Fault"; Section 4; 42 pages; GR–1089–CORE; Issued Dec. 2, 1997; Revision Feb. 1, 1999.

* cited by examiner

Primary Examiner—Christine K. Oda
(74) Attorney, Agent, or Firm—Danamraj & Youst, P.C.; Richard A. Mysliwiec; V. Lawrence Sewell

(57) ABSTRACT

A portable power fault testing apparatus for testing telecommunications equipment's line cards to BellCore's AC power fault standards. A switched transformer unit is coupled to a single-phase AC line voltage source for generating a switched voltage output in 0–220 volt range or in 0–1100 volt range. A primary control relay is coupled to the switched transformer unit for applying the switched voltage output for selected time durations under control of an external computer. A test selector switch coupled to the primary control relay connects the switched voltage output to either a resistive test circuit portion or an inductive test circuit portion, each of which is designed to comply with the respective AC power fault testing conditions.

20 Claims, 4 Drawing Sheets

1ST LEVEL POWER FAULT TESTING APPARATUS FOR TESTING TELECOMMUNICATIONS EQUIPMENT

CROSS-REFERENCE TO RELATED APPLICATION(S)

This application discloses subject matter related to the subject matter disclosed in the following commonly owned co-pending patent application(s): (i) "$2^{nd}$ Level Power Fault Testing Apparatus For Testing Telecommunications Equipment," filed Jan. 3, 2001, Ser. No.: 09/753,885, in the name(s) of: Gary L. Swale.

BACKGROUND OF THE INVENTION

1. Technical Field of the Invention

The present invention relates to testing equipment for telecommunications equipment. More particularly, and not by way of any limitation, the present invention is directed to an AC power fault machine capable of testing telecom line cards to known power fault immunity criteria.

2. Description of Related Art

Telecommunications (telecom) equipment deployed in today's networks is required to comply with various governmental and industry standards not only to ensure seamless interoperability which reduces the risk of service interruption resulting from third-party product failures, but also to address various product safety issues. Accordingly, equipment manufacturers test their products to telecom industry standards commonly known as BellCore specifications (also sometimes referred to as Telcordia™ specifications) which define an extensive list of electromagnetic compliance (EMC), product safety, and environmental requirements.

The BellCore specifications comprise two sets of testing standards, GR-1089-CORE and GR-63-CORE. The tests in GR-1089-CORE deal primarily with electrical phenomena, whereas the tests in GR-63-CORE are predominantly environmental in nature. While each set of standards is quite extensive, typically only a subset of the tests are required based on the type of equipment and its intended operating environment. Together, these two sets of standards specify the electrical and environmental requirements that networking hardware must meet in order to be located in a telco building, e.g., the telco's central office (CO).

Besides the testing requirements, which are determined by product type, BellCore has defined additional testing levels generally referred to in the telecom industry as Telcordia™'s Network Equipment Building Systems (NEBS) levels. The appropriate NEBS level for a particular equipment is determined, again, by its intended operating environment and specific requirements of the Regional Bell Operating Companies (RBOCs). Generally, a higher NEBS level indicates a more stringent testing specification.

NEBS testing verifies that telecom equipment can operate successfully under certain electrical and physical environmental stresses and not pose a safety hazard to personnel and users. These stresses and hazards include earthquakes, airborne contaminants, fire and smoke, electromagnetic interference (EMI), electrical safety, and grounding.

Requirements under the three NEBS levels may be summarized as follows: Level 1 includes: electrical safety; lighting and AC power fault ($2^{nd}$ level); bonding and grounding; emissions; and fire resistance; Level 2 includes: all of Level 1 in addition to—electrostatic discharge (ESD) under normal operation; emissions and immunity; lighting and AC power fault ($1^{st}$ level); ambient temperature and humidity (operating); earthquake Zone 2 and office vibration; and airborne contaminants (indoor level); Level 3 includes: all of Level 1 and Level 2 in addition to—ESD (installation and repair); open door emissions and immunity; ambient temperature and humidity (short-term); earthquake Zone 4; airborne contaminants (outdoor level); and transportation and handling. Each test within these three Levels is defined in either the GR-1089-CORE or GR-63-CORE documentation.

Testing of telecom ports, i.e., tip-and-ring (T and R) interfaces of the line cards utilized in telecom equipment, for lightning and AC power fault immunity in accordance with the above-referenced standards is necessary for several reasons. Power companies and the Local Exchange Carriers (LECs) often serve the same customers, and frequently employ joint-use facilities such as supporting structures or a common trench for their respective outside plant. Metallic conductors, such as cable or wire pairs serving telecom equipment may be exposed to electrical surges resulting from lightning and commercial power system disturbances. Despite the presence of protective devices in the telecommunications network that limit the effect of lightning and power surges, a portion of these disturbances can be impressed on the network equipment. Accordingly, under abnormal conditions, for instance, the power and telecommunications lines may come into electrical contact. If the contact occurs to a primary power line, faults may be cleared quickly by the power system (5 seconds or less), and protectors (e.g., carbon blocks) can limit 60 Hz voltages appearing on the T or R conductors to maximum of approximately 600 VRMS with respect to ground. If the contact occurs to a secondary power line, the full secondary voltage with respect to ground (up to about 275 VRMS in some cases) may appear on the T and R conductors, which may persist indefinitely as the secondary fault may not be cleared by the power system.

Moreover, because electric power lines and telecom lines often occupy parallel routes as a result of a common right-of-way, the magnetic field produced by currents in a nearby power line, especially under abnormal conditions such as a phase-to-ground fault, may result in large voltages being induced into the telecom lines through electromagnetic coupling. The induced voltages appear longitudinally in the T and R conductors and may approach several hundred volts. Lower levels of induction may result from a high-impedance power fault such as a phase conductor falling to the earth. If the resulting unbalanced current is within the normal operating range of the power system, or if power system breakers or fuses do not operate, the fault may persist for an extended period of time.

Under the BellCore's GR-1089-CORE standard, the lightning surge and AC power fault immunity criteria include compliance with various tests such as short-circuit tests (tip to ring, tip to ground with ring open-circuited, ring to ground with tip open-circuited, tip and ring to ground simultaneously, et cetera) and several AC power fault tests. As set forth hereinabove, these criteria are separated into $1^{st}$ level and $2^{nd}$ level criteria. To comply with the $1^{st}$ level criteria, it is required that the telecom equipment under test (i.e., EUT) be undamaged and continue to operate properly after power stress is removed. To comply with the $2^{nd}$ level criteria, the EUT may sustain damage, but it is required that the equipment not become a fire, fragmentation (that is, forceful ejection of fragments), or an electrical safety hazard.

While several lightning machines are available for conducting the lightning compliance tests required under the BellCore standards alluded to hereinabove, there is a paucity of appropriate AC power fault (PF) machines capable of sourcing power to telecom units under test for adequately conducting the AC power fault compliance tests. Further, the relatively few solutions extant today are beset with various shortcomings and drawbacks. First, the existing AC power fault machines are typically custom-designed to a large extent and, accordingly, incapable of accommodating various telecom equipment types and form factors. Additionally, these machines are quite expensive to manufacture owing at least in part to their custom design. In spite of the custom design, however, the existing PF machines are not capable of providing power safely to the EUT to conduct power fault tests at higher voltages as required under the relevant BellCore standards. Furthermore, the conventional PF machines are too bulky for portable testing applications, thereby requiring an extensive (and expensive) dedicated laboratory facility.

SUMMARY OF THE INVENTION

Accordingly, the present invention advantageously provides a portable yet versatile power fault testing apparatus for testing telecommunications equipment's line cards to BellCore's $1^{st}$ Level AC power fault standards in low voltage as well as high voltage ranges. In the presently preferred exemplary embodiment of the present invention, a switched transformer unit is coupled to a single-phase AC line voltage source via a circuit breaker, isolation transformer and an autotransformer. The switched transformer unit is operable to generate a switched voltage output in 0–220 volt range or in 0–1100 volt range. A primary control relay is coupled to the switched transformer unit for applying the switched voltage output for selected time durations under control of an external computer which is interfaced via suitable interface electronics circuitry. Preferably, an AC-to-DC converter is included in the apparatus for providing DC power to the interface electronics.

A test selection switch coupled to the primary control relay connects the switched voltage output to either a resistive test circuit portion or an inductive test circuit portion, each of which is designed to comply with the respective AC power fault testing requirements.

The resistive test circuit portion preferably includes four identical test circuit branches to couple to either two-wire or four-wire T/R interfaces of a line card. Each test circuit branch is comprised of a plurality of resistors and a pair of relays whose operation is controlled by a three-position switching circuit. Preferably, six resistors of equal value (e.g., 200 ohms) are coupled in a predetermined network configuration such that the three positions of the switching circuit are operable to provide an equivalent resistance of 150 ohms, 600 ohms or 1000 ohms on each branch.

The inductive test circuit portion includes an inductive test transformer whose primary coil side is operable to be connected to the switched voltage output via the test selection switch. The secondary coil side is comprised of two secondary coils that provide two output voltage nodes operable to be coupled to the T/R interface of the line card under test. A plurality of capacitors are disposed between the two output voltage nodes as well as between each voltage node and the ground.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
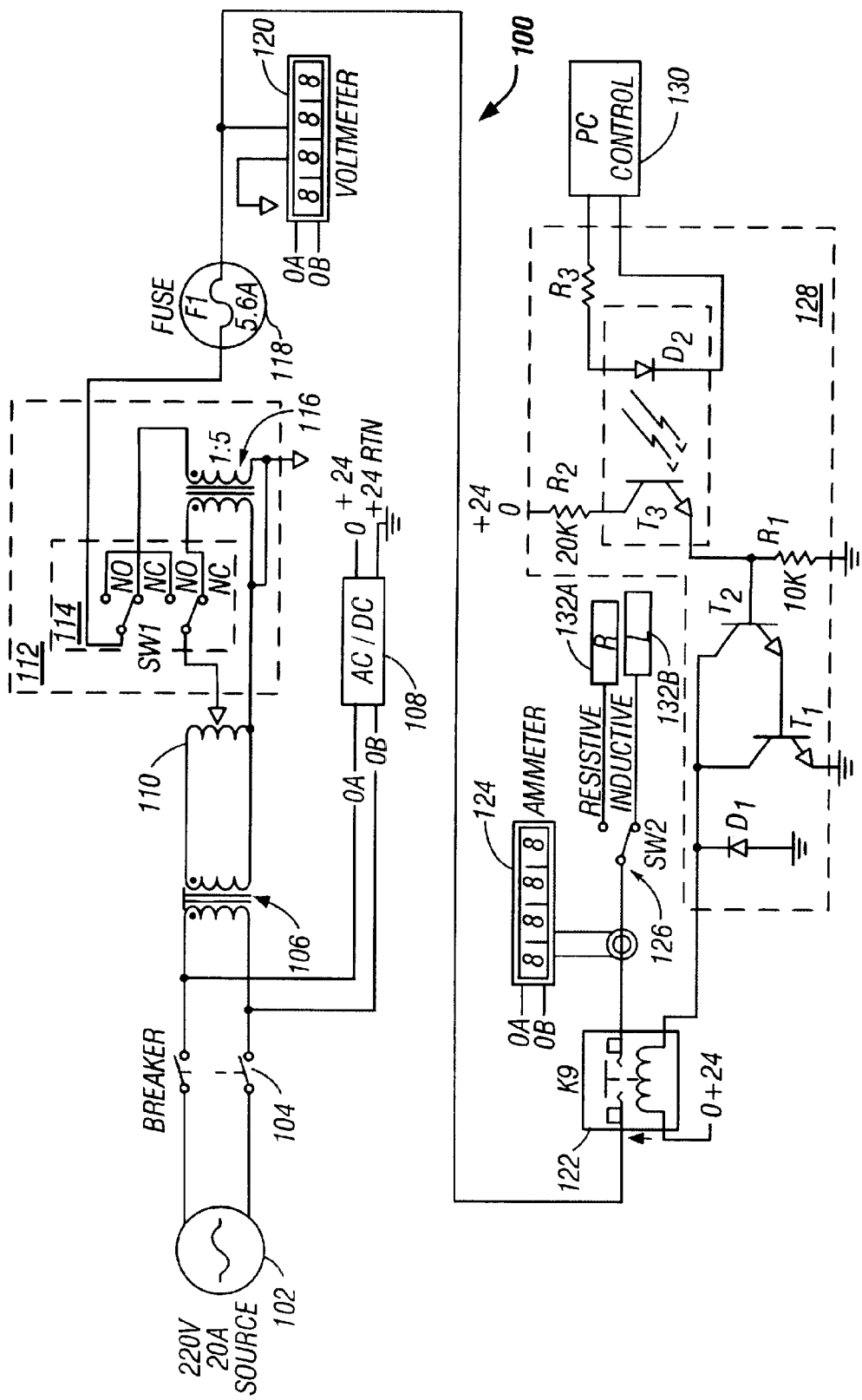
FIG. 1 depicts a schematic diagram of a presently preferred exemplary embodiment of a power fault machine provided in accordance with the teachings of the present invention for testing telecommunications equipment.

In the drawings, like or similar elements are designated with identical reference numerals throughout the several views thereof, and the various elements depicted are not necessarily drawn to scale. Referring now to FIG. 1, depicted therein is a schematic diagram of a presently preferred exemplary embodiment of a power fault (PF) apparatus 100 provided in accordance with the teachings of the present invention for testing telecommunications equipment (EUT), e.g., line cards either mounted in a rack, chassis, etc., or otherwise, to BellCore's AC power fault standards as set forth in GR-1089-CORE, Section 4 (Issue 2, Rev. 1), which is incorporated by reference herein. More specifically, the PF apparatus 100 provides an AC source that is operable in accordance with the electrical conditions specified in Requirement R4-16 and parts of Requirement R4-34 of GR-1089-CORE, Section 4, in both low voltage as well as high voltage ranges. Thus, the PF apparatus 100 may hereinafter be referred to as $1^{st}$ Level PF machine for purposes of the present invention.

Preferably, the PF machine 100 is operable to test either two-wire (T/R pair) or four-wire (T/R and T1/R1 pairs) interfaces of the telecom line cards (not shown). In the presently preferred exemplary embodiment of the present invention, the PF machine 100 operates from a single-phase AC line source 102 such as, e.g., a 220 VAC source, that is commonly available. Those skilled in the art should appreciate that the use of a 220 VAC source in the PF machine 100 ensures that a safe amount of current is drawn in the system while still satisfying the electrical requirements under the BellCore standards.

A circuit breaker 104, preferably rated to 20 A, is operably coupled to the AC source 102 in order to selectably provide power to the PF machine 100 for its operation. An AC-to-DC converter 108 is preferably coupled to the AC line for converting the AC power to a DC source (e.g., 24 VDC) which is used for powering the internal control electronics of the PF machine 100 set forth in detail hereinbelow.

The AC line is coupled to an isolation transformer 106 operating to electrically isolate and equalize the PF machine 100 and EUT. Essentially, the isolation transformer 106 ensures that ground of the PF machine 100 is at the same potential as ground of the EUT so as to prevent hazardous arcing therebetween.

The AC input power is thereafter provided to the input of a 1:1 autotransformer 110 having a manually adjustable output. The output of the autotransformer 110 is operable to be coupled to switched voltage means 112 comprising a switch section 114 and a 1:5 step-up transformer unit 116. It should be appreciated that the switch/transformer combination unit is operable as the switched voltage means for generating a switched voltage output based on the single-phase AC line voltage source 102. Preferably, the switch section 114 is manually operable to connect to, or bypass, the step-up transformer 116 for providing a switched voltage output of either 0–220 volts (for testing in the lower voltage requirements) or 0–1100 volts (for testing in full voltage range).

It should be appreciated by those skilled in the art that using the switching technique as set forth herein allows higher currents at lower voltages, thereby decreasing the required size of the transformers. Further, both autotransformer 110 and step-up transformer 116 are preferably rated to provide steady state and transient currents indefinitely.

A fuse link arrangement 118 (e.g., a fuse operable at about 5 A) is coupled to the switched voltage output provided by the switched transformer unit 112 for electrical safety. Also, a digital voltmeter 120 is provided in the presently preferred exemplary embodiment of the present invention for continuously monitoring the adjustable switched voltage output.

The switched voltage output is coupled via fuse 118 to the input of a primary control relay 122 which is preferably comprised of a vacuum-sealed relay, designed to switch voltages up to 1800 VDC. The primary control relay 122 is controlled, via interface electronics circuitry 128, by an external computer 130 (e.g., a personal computer for portability) which provides precise, repetitive, time duration control of the switched voltage output.

The primary control relay 122 is operable to energize the EUT for precisely selected periods of time under computer control. By operating the computer 130, a test sequence of energized periods followed by deenergized periods can be repetitively effectuated in accordance with the existing power fault testing requirements.

As alluded to hereinabove, the interface electronics circuitry 128 is powered by the DC power provided by the AC/DC converter 108, and is comprised of a plurality of power transistors (e.g, T1, T2, and T3), a plurality of resistors (e.g., R1, R2, and R3), diodes D1 and D2, and other elements such as optical isolators. Those skilled in the art should readily recognize that the exact arrangement of the interface circuitry formed from these elements as depicted in FIG. 1 is illustrative rather than restrictive or limiting. Other arrangements may be had by using different electronic components to achieve appropriate interfacing between PC control 130 and the primary control relay 122.

The output of the primary control relay 122 is connected to a test selector switch 126 which is preferably manually operable to connect the applied power to either a resistive test circuit portion via node 132A or an inductive test circuit portion via node 132B. Further, the output of the primary control relay means 122 is also monitored by an ammeter 124 for calibration and monitoring purposes. Preferably, the ammeter 124 uses a toroid sensing coil to preclude the possibility of shock hazards.

Figure 2A:
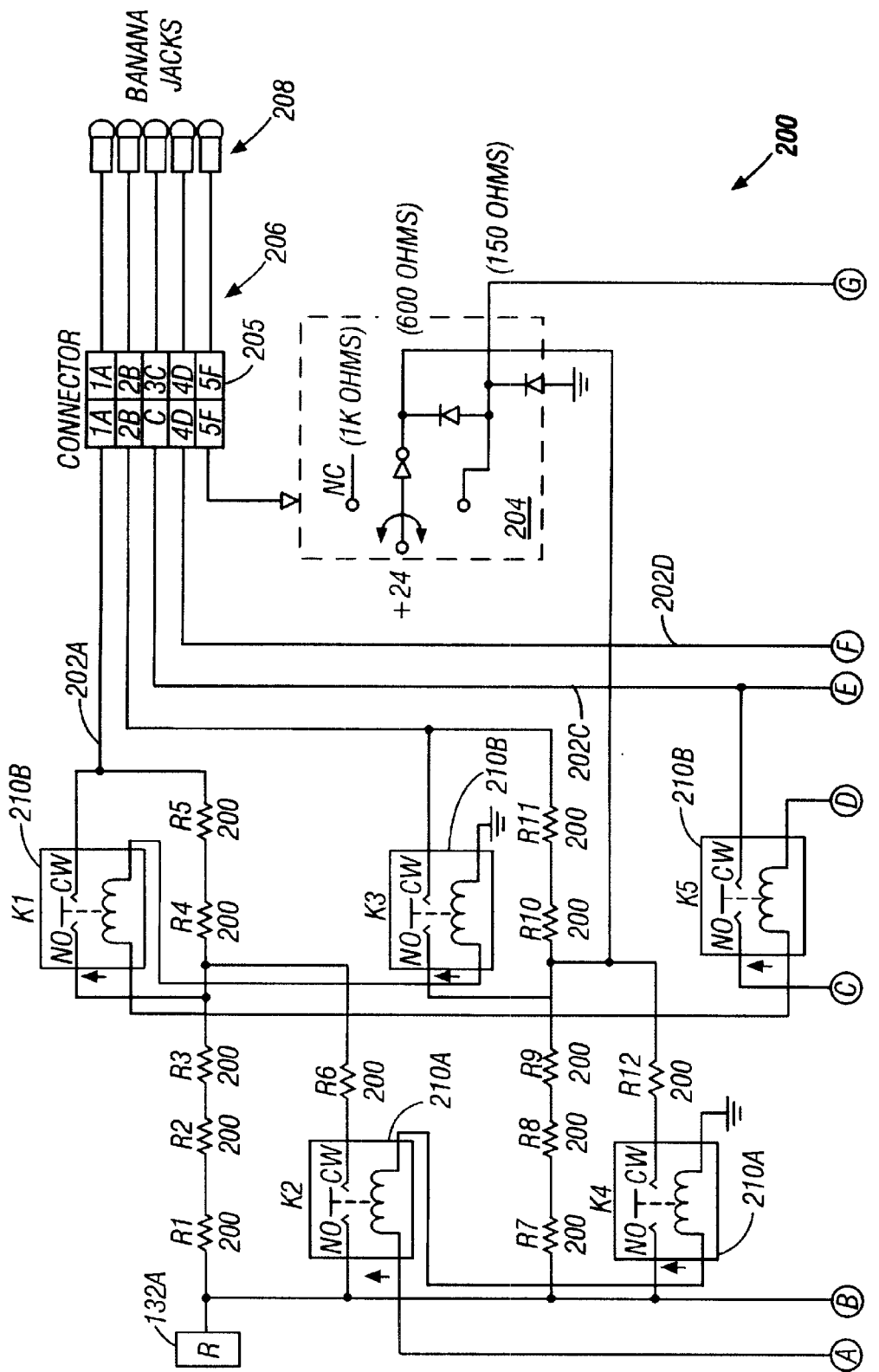
FIG. 2 depicts a schematic diagram of a resistive testing circuit for use in testing telecommunications equipment with the power fault machine of the present invention.
Figure 2B:
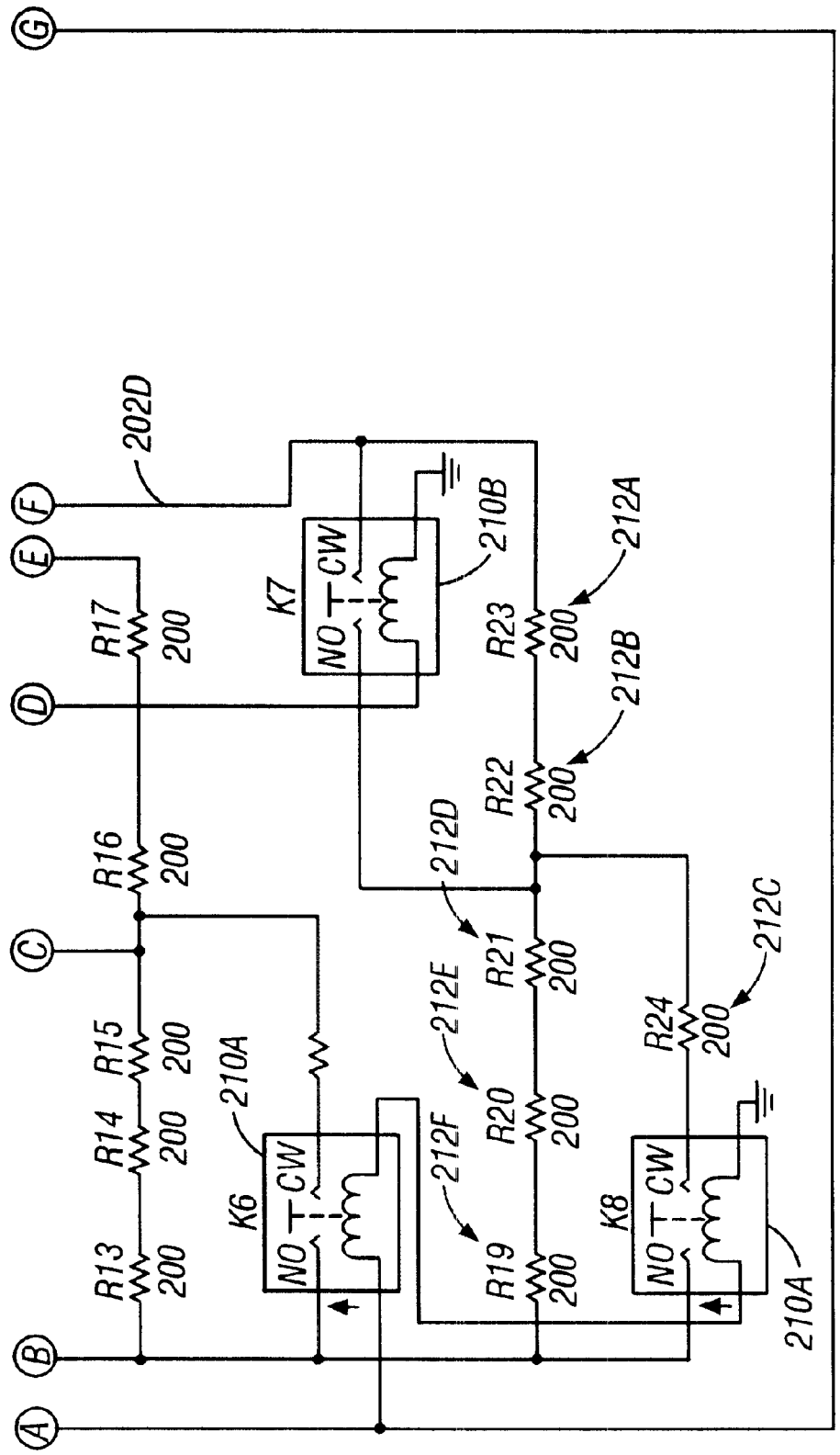

Referring now to FIG. 2, depicted therein is a schematic diagram of a presently preferred exemplary embodiment of a resistive testing circuit portion 200 for use in testing telecommunications equipment with the PF machine of the present invention. Preferably, the resistive testing circuit 200 is comprised of a plurality of identical resistor network branches, each comprising a plurality of identical resistors and one or more relays. The relays are preferably a low cost derivative of the primary control relay 122 shown in FIG. 1. They are designed to make and conduct, but not break, load current at a specified voltage.

In the exemplary embodiment depicted in FIG. 2, when the test selector switch 126 (shown in FIG. 1) is set to node 132A, the applied voltage is connected to the inputs of four identical network branches wherein reference numerals 202A through 202D refer to the branch outputs. Each branch includes, in turn, six 200 ohm, 25 Watt, ±5% resistors. Thus, the four branches of the exemplary resistive testing circuit portion 200 comprise a total of 24 resistors.

Reference numerals 212A–212F exemplify the six resistors for branch 202D arranged in a series-parallel combination that is controlled by relays 210A and 210B. A total of eight relays are provided accordingly in the exemplary resistive testing circuit portion 200. A three-position switching circuit 204 controls the operation of eight relays. When the relays are open, each branch sees five resistors in series (e.g., resistor 212F, resistor 212E, resistor 212D, resistor 212B, and resistor 212A), giving rise to an equivalent resistance of 1000 ohms. When relay 210B is asserted, resistors 212A and 212B are shunted by a short circuit. An equivalent of 600 ohms is accordingly obtained (because relay 210A is open and the three series resistors, e.g., resistor 212F, resistor 212E, and resistor 212D are additive). In the final position, the switching circuit 204 is operable to short both relays 210A and 210B in a branch, thereby an equivalent resistance of 150 ohms is obtained (because the equivalent of three series resistors, e.g., resistor 212F, resistor 212E, and resistor 212D, is in parallel arrangement with respect to one 200 ohm resistor, e.g., resistor 212C).

Continuing to refer to FIG. 2, the three-position switching circuit 204 is thus operable to select the network resistance to be either 150, 600, or 1000 ohms per branch. The output of each branch is coupled to an output connector 205 of the PF machine 100. An external cable connector 206 (preferably about 6 ft. in length) connects the four independent resistive network lines and the return line to the EUT via a "banana jack" arrangement 208.

Those skilled in the art should readily recognize that the resistive testing circuit portion 200 is operable to connect to both two-wire interfaces as well as four-wire interfaces of the EUT for conducting AC power fault tests. For each type of interface, two sets of test conditions may be specified. Test Condition Set A for a two-wire interface involves three connections: (i) tip to the PF machine's resistive testing circuit portion and ring to ground; (ii) ring to the PF machine's resistive testing circuit portion and tip to ground; and (iii) both tip and ring connected to the PF machine's resistive testing circuit portion simultaneously. Test Condition Set B for the two-wire interface also involves a simultaneous connection between the PF machine and T/R nodes of the EUT.

Test Condition Set A for a four-wire interface involves the following connections: (i) each lead (T, R, T1, and R1) is connected to the PF machine with the remaining lead(s) coupled to ground; (ii) T and R are coupled to the PF machine simultaneously and the T1/R1 pair is grounded; and (iii) T1 and R1 are coupled to the PF machine simultaneously and the T/R pair is grounded. Finally, Test Condition Set B for the four-wire interface involves connecting the T, R, T1, and R1 leads to the PF machine's four resistive network branches simultaneously.

As is required under the AC power fault testing conditions, other leads of the EUT that connect to outside telecom plant should be grounded during testing and the tests should be repeated with these leads terminated as in service. As to the leads that do not connect to outside telecom plant, they should be terminated as is appropriate for the operating mode(s) of the EUT.

Figure 3:
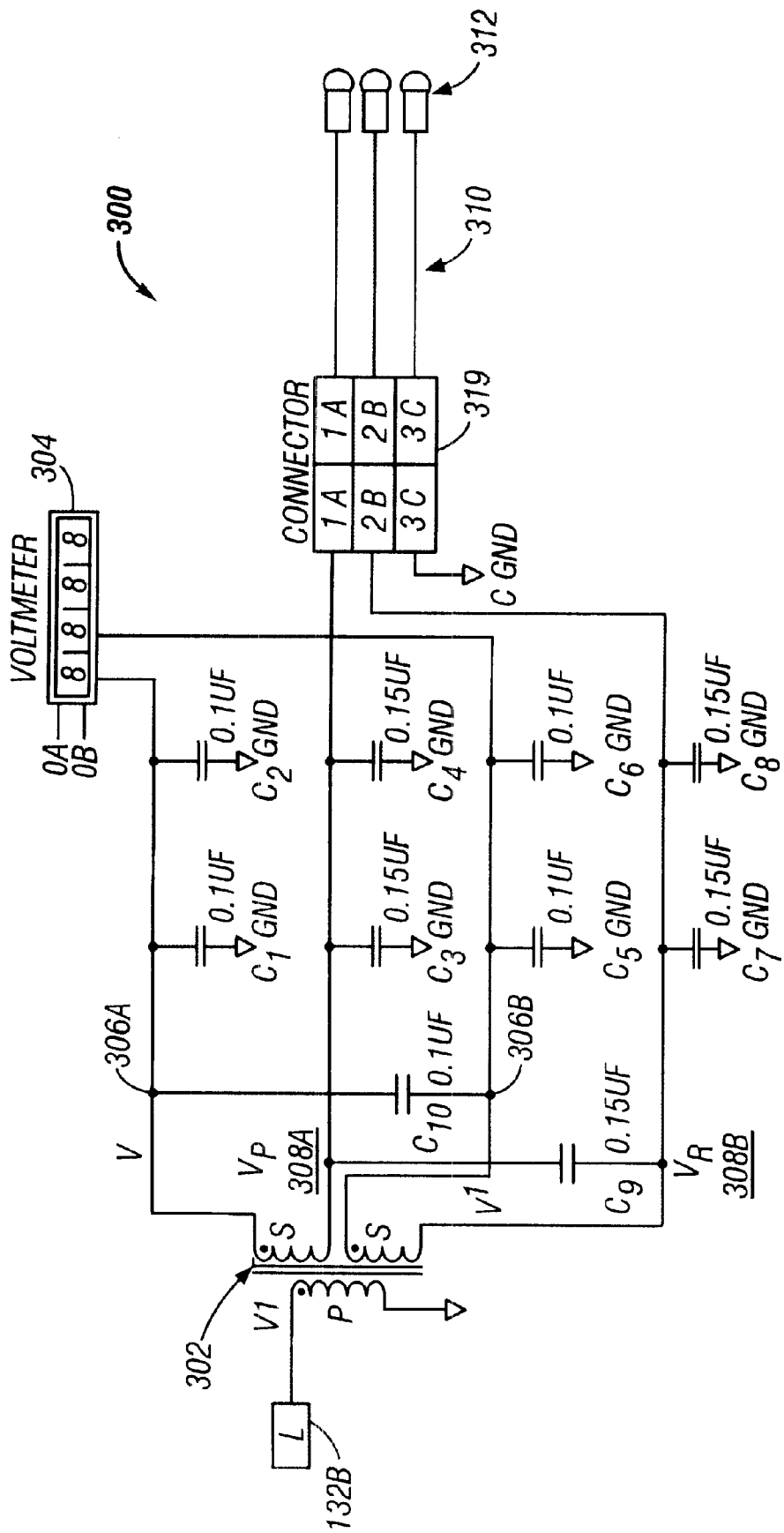
FIG. 3 depicts a schematic diagram of an inductive testing circuit for use in testing telecommunications equipment with the power fault machine of the present invention.

FIG. 3 a schematic diagram of a presently preferred exemplary embodiment of an inductive testing circuit portion 300 for use in testing telecommunications equipment with the PF machine of the present invention. When the test selector switch 126 (shown in FIG. 1) is set to node 132B, the applied power is connected to the primary (P) coil side of an inductive test transformer 302, which is preferably comprised of a 1:8.33, dual output, step-up transformer. A pair of test output voltage nodes $V_T$ 308A and $V_R$ 308B are disposed on the secondary (S) coil side of the transformer 302, one on each secondary output. While the primary-to-secondary turns ratio ($N_p:N_s$) of the transformer may be arbitrary, it is recommended that the number of turns be the same for the two secondary side coils.

Two voltage reference nodes, V (reference numeral 306A) and V' (reference numeral 306B), are also provided on the secondary side, which nodes are coupled to a voltmeter 304. A plurality of capacitors are disposed between V node 306A and ground; V' node 306B and ground; between V and V' nodes; between $V_T$ node 308A and ground; $V_R$ and ground; and between $V_T$ and $V_R$ nodes. In the presently preferred exemplary embodiment of the inductive test circuit portion 300, capacitors $C_1$ through $C_{10}$ exemplify the capacitive network formed from the various node-to-ground and inter-nodal capacitances set forth in the foregoing, wherein the effective capacitances are as follows: 0.2 $\mu F$ between V node 306A and ground and between V node 306A and ground; 0.3 $\mu F$ between $V_T$ node 308A and ground and between $V_R$ and ground; 0.1 $\mu F$ between V and V' nodes; and 0.15 $\mu F$ between $V_T$ and $V_R$ nodes.

Continuing to refer to FIG. 3, $V_T$ and $V_R$ nodes 308A, 308B, and ground line of the transformer 302 are connected to an output connector 319. An external cable 310 (about 6 ft. in length) is provided for connecting the output connector 319 to the EUT via a banana jack arrangement 312.

The digital voltmeter 304 is operable to allow precise output voltage selection without bringing the wires out along with the cabling. During testing, it is recommended that the EUT be connected and powered as in normal service. The inductive test circuit portion 300 is prepared for testing by adjusting the applied voltage from the PF machine (at node 132B) until the voltage measured with respect to ground at V and V' nodes equals 600 VRMS. After adjusting the input voltage, sixty 5-second voltage pulses may be applied to the EUT as per the $1^{st}$ level testing conditions of the BellCore standard. For $1^{st}$ level tests of equipment specified for central office application only, the setup of the inductive test circuit portion 300 may be somewhat modified when voltage-limiting protectors (such as, e.g., 3-mil-gap carbon blocks or equivalent) are specified for use with the EUT. In this scenario, the input voltage at node 132B should be adjusted until the voltage at V or V' equals 600 VRMS, or the peak voltage at $V_T$ and $V_R$ nodes equals the DC breakdown voltage of the primary protector specified for use with the EUT.

Based upon the foregoing Detailed Description, it should be readily apparent that the present invention provides an innovative AC power source solution that complies with the existing standards for power fault testing of telecom equipment without the shortcomings and deficiencies of the conventional AC power fault machines. The portable, and yet versatile, design of the PF machine provided in accordance with the teachings of the present invention uses a mixture of off-the-shelf and custom designed components to meet the necessary full-range AC requirements. Because the steady state output power requirements of the PF machine are lower than the transient requirements, smaller components (e.g., resistors, transformers, etc.) can be advantageously utilized. It should be apparent that the use of such smaller components can give rise to significant cost and size reductions.

Moreover, the presently preferred exemplary embodiment of the present invention uses the same or substantially the same components for a variety of tasks. For instance, the internal power supply and assorted meters operate from the same supply voltage. In addition, rather than using specific value resistors, and increase the number of relays, single value resistors are advantageously used for optimizing the overcall cost and manufacturability.

Further, it is believed that the operation and construction of the present invention will be apparent from the foregoing Detailed Description. While the apparatus shown and described has been characterized as being preferred, it should be readily understood that various changes and modifications could be made therein without departing from the scope of the present invention as set forth in the following claims.

What is claimed is:

1. A power fault testing apparatus for testing an equipment under test (EUT), comprising:
    a switched transformer unit for generating a switched voltage output based on a single-phase AC line voltage source;
    a primary control relay coupled to said switched transformer unit for applying said switched voltage output for selected time durations; and
    a selector switch coupled to said primary control relay, said selector switch operating to couple said switched voltage output to one of an inductive test circuit portion and a resistive test circuit portion, wherein said EUT is operable to be coupled to an output provided by at least one of said inductive and resistive test circuit portions.

2. The power fault testing apparatus for testing an EUT as set forth in claim 1, further comprising:
    a circuit breaker coupled to said single-phase AC line voltage source for selectably powering up said power fault testing apparatus;
    an isolation transformer coupled to said circuit breaker for electrically equalizing said EUT with respect to said power fault testing apparatus so as to prevent arcing therebetween; and
    an autotransformer with a manually adjustable output coupled to a switch section of said switched transformer unit.

3. The power fault testing apparatus for testing an EUT as set forth in claim 2, further comprising a fuse disposed between said switched transformer unit and said primary control relay.

4. The power fault testing apparatus for testing an EUT as set forth in claim 2, further comprising interface electronics circuitry for interfacing between said primary control relay and an external computer operable to control said primary control relay.

5. The power fault testing apparatus for testing an EUT as set forth in claim 4, further comprising an AC-to-DC converter coupled to said single-phase AC line voltage source via said circuit breaker, said AC-to-DC converter operating to provide DC power for powering up said interface electronics circuitry.

6. The power fault testing apparatus for testing an EUT as set forth in claim 4, wherein said external computer comprises a personal computer.

7. The power fault testing apparatus for testing an EUT as set forth in claim 2, further comprising at least one voltmeter and at least one ammeter for taking voltage and current measurements.

8. The power fault testing apparatus for testing an EUT as set forth in claim 7, wherein said at least one ammeter includes a toroid sensing coil to prevent electrical shock hazards.

9. The power fault testing apparatus for testing an EUT as set forth in claim 2, wherein said resistive test circuit portion comprises:
- a plurality of test circuit branches, each including a pair of relays and a plurality of resistors;
- a switching circuit operable to control said pair of relays on each test circuit branch so to provide a selectable resistive value on said test circuit branches; and
- a cable connector for coupling said resistive test circuit portion to said EUT.

10. The power fault testing apparatus for testing an EUT as set forth in claim 9, wherein said plurality of resistors comprises six resistors, each having a resistance of about 200 ohms, and further wherein said switching circuit is operable to activate each test circuit branch in three positions, said three positions giving rise to an equivalent resistance of about 150 ohms, 600 ohms and 1000 ohms for each of said test circuit branches.

11. The power fault testing apparatus for testing an EUT as set forth in claim 2, wherein said inductive test circuit portion comprises:
- an inductive test transformer having its primary coil side operable to receive said switched voltage output via said selector switch;
- a pair of output voltage nodes disposed on said inductive test transformer's secondary coil side for coupling with a tip-and-ring interface of a line card forming a portion of said EUT;
- a plurality of capacitors disposed between said pair of output voltage nodes and between each of said output voltage nodes and a ground; and
- a cable connector for coupling said inductive test circuit portion to said EUT.

12. The power fault testing apparatus for testing an EUT as set forth in claim 11, wherein said plurality of capacitors disposed between said pair of output voltage nodes have an equivalent capacitance of about 0.15 microfarads.

13. The power fault testing apparatus for testing an EUT as set forth in claim 12, wherein said plurality of capacitors disposed between said each of said pair of output voltage nodes and said ground have an equivalent capacitance of about 0.3 microfarads.

14. A power fault testing apparatus for testing telecommunications equipment's line cards, comprising:
- power source means for sourcing a single-phase AC voltage of about 220 volts;
- switched voltage means for generating a switched voltage output based on said single-phase AC source voltage;
- relay means coupled to said switched voltage means for applying said switched voltage output for selected time durations under control of a computer interfaced thereto through interface electronics circuitry; and
- switching means coupled to said relay means for coupling said switched voltage output to one of an inductive test circuit portion and a resistive test circuit portion, wherein each of said inductive and resistive test circuit portions is operable to be coupled to a tip-and-ring interface of a telecommunications equipment line card.

15. The power fault testing apparatus for testing telecommunications equipment's line cards as set forth in claim 14, further comprising:
- a circuit breaker coupled to said power source means for selectably powering up said power fault testing apparatus;
- an isolation transformer coupled to said circuit breaker for electrically equalizing said line card with respect to said power fault testing apparatus so as to prevent arcing therebetween;
- an autotransformer with a manually adjustable output coupled to a switch section of said switched voltage means;
- fuse means disposed between said switched voltage means and said relay means; and
- an AC-to-DC converter coupled to said power source means via said circuit breaker for providing DC power to said interface electronics circuitry.

16. The power fault testing apparatus for testing telecommunications equipment's line cards as set forth in claim 15, wherein said resistive test circuit portion comprises:
- four test circuit branches for coupling with said tip-and-ring interface of said line card through a cable connector, each branch including a pair of relays and a plurality of resistors; and
- a switching circuit operable to control said pair of relays on each test circuit branch so to provide a selectable resistive value on said test circuit branches.

17. The power fault testing apparatus for testing telecommunications equipment's line cards as set forth in claim 16, wherein said plurality of resistors comprises six resistors, each having a resistance of about 200 ohms, and further wherein said switching circuit is operable to activate each test circuit branch in three positions, said three positions giving rise to an equivalent resistance of about 150 ohms, 600 ohms and 1000 ohms for each of said test circuit branches.

18. The power fault testing apparatus for testing telecommunications equipment's line cards as set forth in claim 15, wherein said inductive test circuit portion comprises:
- an inductive test transformer having its primary coil side operable to receive said switched voltage output via said switching means;
- a pair of output voltage nodes disposed on said inductive test transformer's secondary side for coupling with said tip-and-ring interface of said line card through a cable connector; and
- a plurality of capacitors disposed between said pair of output voltage nodes and between each of said output voltage nodes and a ground.

19. The power fault testing apparatus for testing telecommunications equipment's line cards as set forth in claim 18, wherein said plurality of capacitors disposed between said pair of output voltage nodes have an equivalent capacitance of about 0.15 microfarads.

20. The power fault testing apparatus for testing telecommunications equipment's line cards as set forth in claim 18, wherein said plurality of capacitors disposed between said each of said pair of output voltage nodes and said ground have an equivalent capacitance of about 0.3 microfarads.

* * * * *